(12) United States Patent
Edwards

(10) Patent No.: US 9,461,032 B1
(45) Date of Patent: Oct. 4, 2016

(54) BIPOLAR ESD PROTECTION DEVICE WITH INTEGRATED NEGATIVE STRIKE DIODE

(71) Applicant: Texas Instruments Incorporated, Dallas, TX (US)

(72) Inventor: Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/933,661

(22) Filed: Nov. 5, 2015

(51) Int. Cl.
*H01L 27/02* (2006.01)
*H01L 29/73* (2006.01)
*H01L 29/06* (2006.01)

(52) U.S. Cl.
CPC ........... *H01L 27/0259* (2013.01); *H01L 29/06* (2013.01); *H01L 29/0619* (2013.01); *H01L 29/0626* (2013.01); *H01L 29/7304* (2013.01)

(58) Field of Classification Search
CPC ....... H01L 27/02; H01L 27/06; H01L 29/06; H01L 29/73; H01L 29/74; H01L 29/417; H01L 31/111
USPC .......................................................... 257/355
See application file for complete search history.

(56) References Cited

U.S. PATENT DOCUMENTS

| 5,760,448 | A | * | 6/1998 | Maeda | H01L 27/0259 257/362 |
|---|---|---|---|---|---|
| 6,433,395 | B2 | * | 8/2002 | Hsu | 257/355 |
| 7,638,847 | B1 | * | 12/2009 | O | H01L 27/0259 257/173 |
| 7,973,386 | B1 | | 7/2011 | Vashchenko et al. | |
| 2006/0175663 | A1 | * | 8/2006 | Jeon | H01L 27/0262 257/355 |
| 2008/0179624 | A1 | * | 7/2008 | Russ | H01L 27/0262 257/173 |
| 2011/0176244 | A1 | * | 7/2011 | Gendron | H01L 27/0259 361/56 |
| 2015/0270708 | A1 | * | 9/2015 | Edwards | H01L 27/0255 361/56 |
| 2015/0340358 | A1 | * | 11/2015 | Edwards | H01L 27/0262 257/357 |

* cited by examiner

*Primary Examiner* — Michael Lebentritt
(74) *Attorney, Agent, or Firm* — Jacqueline J. Garner; Frank D. Cimino

(57) ABSTRACT

A bipolar ESD protection device includes a substrate having a p-type epi layer thereon including an epi region over an n-buried layer (NBL). An n-type isolation tank (iso tank) includes a deep n+ region and NBL for containing an isolated epi region of the epi region. An NPN transistor and an avalanche diode are formed in the isolated epi region. The NPN transistor includes an emitter within a base having a base contact and the collector is a top portion of NBL. The avalanche diode includes a p-type anode region including an anode contact and an n-type cathode region having a cathode contact. The anode region and base are resistively coupled through the epi region. A ground connection couples the emitter to the anode contact and a strike node connection couples the cathode contact to an n+ isolation contact.

15 Claims, 4 Drawing Sheets

BIPOLAR ESD PROTECTION DEVICE WITH INTEGRATED NEGATIVE STRIKE DIODE

FIELD

Disclosed embodiments relate to bipolar devices for protecting integrated circuits from electrostatic discharge damage.

BACKGROUND

Modern high-density integrated circuits (ICs) are known to be vulnerable to damage from electrostatic discharge (ESD) originating from an electrically charged body (human or otherwise) as the charged body physically contacts the IC. ESD damage occurs when the amount of charge exceeds the capability of the electrical conduction path through the IC. The typical ESD failure mechanisms include thermal runaway resulting in junction shorting, and dielectric breakdown resulting in gate-junction shorting in the metal-oxide-semiconductor (MOS) context.

An IC may be subjected to a damaging ESD event in the manufacturing process, during assembly, testing, or in the system application. In conventional IC ESD protection schemes, active clamp circuits are generally used to shunt ESD current between the power supply rails and thereby protect internal IC nodes that are connected to bond pads from ESD damage.

Conventional vertical NPN bipolar devices used for ESD cells for protection of various nodes on an IC typically include a surface n-type region (e.g., surface nwell) on an n+ vertical sinker diffusion that is on an n+ buried layer (NBL) which together provides a collector in one or more device stripes (or fingers) to provide a low resistance-path to carry ESD strike induced current back to the top surface (e.g., top of the surface nwell). In Bipolar Metal Oxide Semiconductor (BiMOS) technologies, it is a common practice to use such vertical NPN devices as the ESD protection circuitry.

In one known arrangement ESD clamp protection is provided by an NPN transistor in a CER configuration, where the NPN's collector terminal is coupled to receive the ESD strike, the emitter is grounded, and the base is tied to the emitter by a resistor referred to as a CER resistor. In this configuration, during a negative ESD strike the voltage developed across the CER resistor is used to turn on the emitter-base diode of the NPN transistor once the collector-base (pn) junction begins to go into impact ionization and avalanche breakdown during an ESD strike.

SUMMARY

This Summary briefly indicates the nature and substance of this Disclosure. It is submitted with the understanding that it will not be used to interpret or limit the scope or meaning of the claims.

Disclosed embodiments recognize during a negative electrostatic discharge (ESD) strike a conventional ESD NPN transistor in the CER configuration is not able to carry the current without developing a large negative voltage since its CER resistor is in series with the current return path through the base of the NPN transistor. As a result, instead a conventional ESD clamp cell (ESD cell) typically adds a separate negative-strike diode so that the ESD cell including three separate components, the NPN transistor, the CER resistor (e.g., about a 1 kohm polysilicon resistor), and the negative-strike diode that is generally implemented from a similarly-rated Laterally Diffused MOSFET (LDMOS) transistor. Often, the NPN transistor only occupies about half of the ESD cell area, with most of the remaining area being taken up by the negative strike diode (see the known ESD cell shown in FIG. 2A described below).

As a result, it is recognized herein that this known ESD cell arrangement occupies about twice as much chip (e.g., silicon) area as would be needed if the NPN transistor (device) itself could conduct the ESD strike-induced current efficiently. Furthermore, the polysilicon CER resistor typically adds a silicide block (SIBLK) mask level to the process so that no silicide is formed on the polysilicon for providing a relatively high sheet resistivity. The negative strike diode also generally adds an ion implant to the process, such as an LDMOS body implant (DWELL) mask level to the process. In contrast, NPN transistors typically do not need either of these mask levels. Accordingly, integrated circuit (IC) products having known ESD cells protecting some of its pins (coupled to nodes) need to include extra mask layers in the fabrication process that support only the fabrication of the ESD cells.

Disclosed embodiments include a bipolar ESD protection device (ESD device) comprising an NPN transistor having integrated negative strike diode(s) and a CER resistor using the p-epi region also used for the NPN transistor. Disclosed ESD devices/NPN transistors function as an ESD cell, where a conventional ESD cell as described above in contrast includes three separate components being the NPN transistor, polysilicon CER resistor and negative strike diode.

Disclosed ESD devices include a substrate having a p-type epitaxial (epi) layer thereon including a p-type epi region over an n-buried layer (NBL). An n-type isolation tank (iso tank) includes a deep n+ region and NBL for containing an isolated epi region of the epi region. An NPN transistor and an avalanche diode are both formed in the isolated epi region. The NPN transistor includes an emitter within a base having a base contact and the collector is a top portion of the NBL. The avalanche diode includes a p-type anode region including an anode contact and an n-type cathode region including a cathode contact. The anode region and base of the NPN transistor are resistively coupled through the isolated epi region. A ground connection couples the emitter to the anode contact of the avalanche diode and a strike node connection couples the cathode contact of the avalanche diode to an n+ isolation contact that is connected to the collector.

Disclosed ESD devices thus couple an avalanche diode within the NPN unit cell comprising at least one NPN transistor. Since the anode of the avalanche diode is grounded and its cathode is tied to the strike node (same node as the NPN transistor's collector), during a negative ESD strike the avalanche diode will turn on and conduct the negative strike current. During a positive strike, the avalanche diode sets the breakdown and trigger voltages of the NPN transistor, hence its voltage rating.

Disclosed ESD devices having an avalanche diode within the NPN unit cell thus render the NPN transistor robust to negative ESD strikes, so that the area consumed by the negative strike diode for conventional ESD cells is not needed and the extra mask cost (particularly the DWELL mask) which is generally optional in a power BiCMOS flow is avoided. Moreover, disclosed ESD device architectures by using the p-epi region for the NPN transistor also for the CER resistor thus do not need a separate CER resistor for efficient ESD clamping operation, so that the chip area for this resistor and the SIBLK mask level can both be eliminated.

BRIEF DESCRIPTION OF THE DRAWINGS

Reference will now be made to the accompanying drawings, which are not necessarily drawn to scale, wherein.

DETAILED DESCRIPTION

Figure 1:
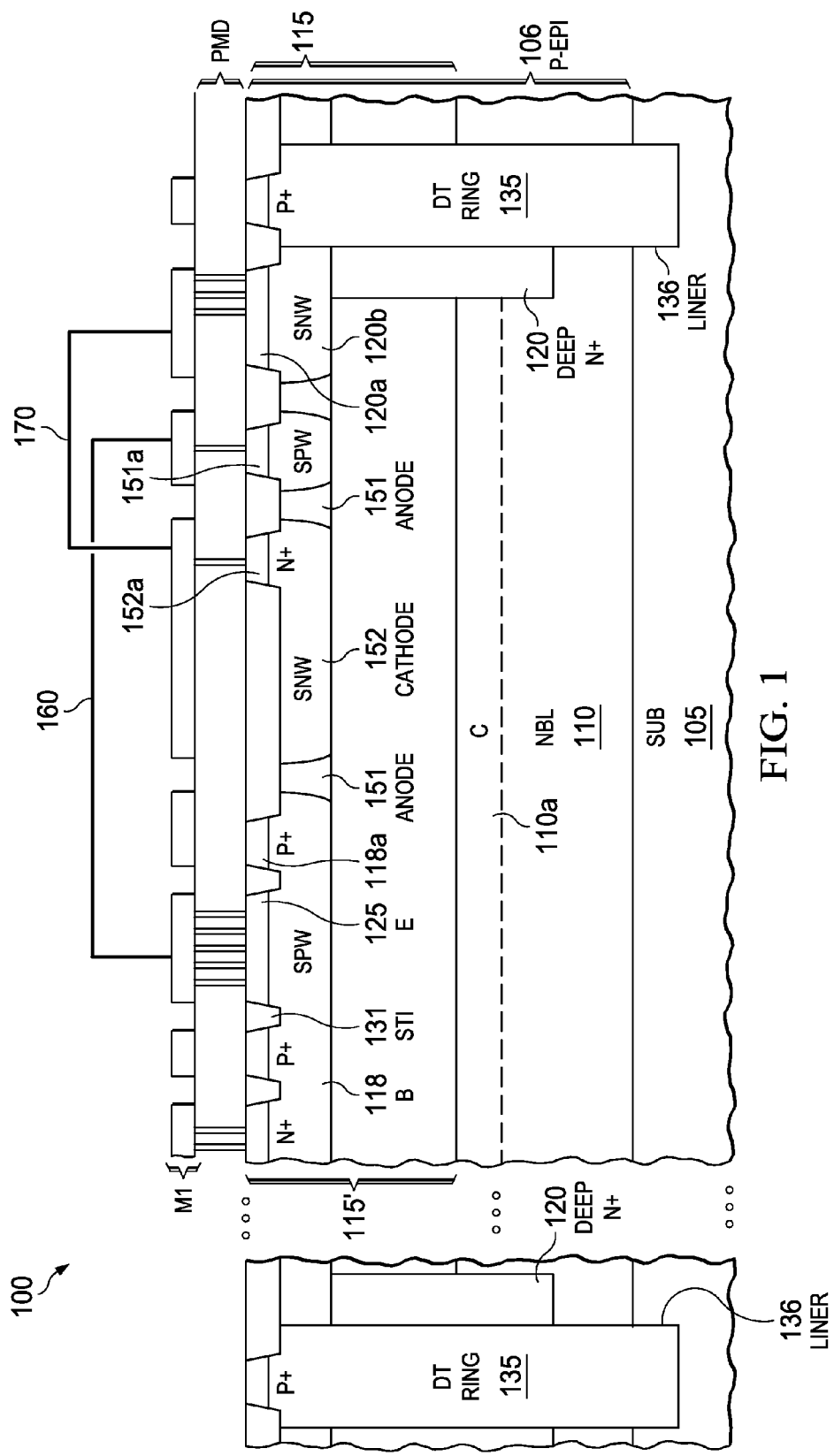
FIG. 1 is a cross sectional depiction of an example ESD device that incorporates an avalanche diode into the NPN transistor unit cell, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a cross sectional view of an example bipolar ESD protection device (ESD device) 100, according to an example embodiment. ESD device 100 includes another half being a mirror image along the left side shown in FIG. 1 with only the leftmost portion showing a side of the outer deep trench ring (DT ring) 135 and the deep n+ 120. ESD device 100 includes a substrate shown as a substrate 105 having a p-epitaxial (p-epi) layer 106 thereon. The p-epi layer 106 may be about 15 μm to 40 μm thick. The substrate 105 is generally a p+ or p-substrate, typically boron doped from $1\times10^{16}$ to $1\times10^{19}$ cm$^{-3}$, and the p-epi layer 106 can have a doping level from $3\times10^{14}$ cm$^{-3}$ to $3\times10^{16}$ cm$^{-3}$. The substrate 105 and the p-epi layer 106 can both comprise silicon, and can also comprise other materials.

An upper p-type epi region (epi region 115) is over an n-buried layer (NBL) 110 in the epi-layer 106. An n-type isolation tank (iso tank 120/110) includes a deep n+ region 120 and the NBL 110 for containing a p-type isolated epi region (isolated epi region) 115' of the epi region 115. The iso tank 120/110 has an n+ isolation contact 120a. An NPN transistor 125/118/110a includes an emitter (E) 125, base (B) 118, and collector (C) 110a, as well as an avalanche diode 151/152 integrated within the NPN transistor with p-type anode 151 and adjacent n-type cathode 152, both transistor and avalanche diode being formed in a common isolated epi region 115'.

The emitter 125 is within the base 118 having a base contact 118a, and the collector 110a is from a top portion of the NBL 110. The NPN transistor 125/118/110a can optionally be part of a bipolar silicon controlled rectifier (SCR), such as an NPNP SCR.

The anode region 151 includes an anode contact 151a and cathode region 152 has a cathode contact 152a. The anode region 151 and base 118 are resistively coupled together through the isolated epi region 115' (thus by an epi resistor, Repi). A ground connection 160 couples the emitter 125 to the anode contact 151a and a strike node connection 170 couples the cathode contact 152a to the n+ isolation contact 120a (and thus to collector 110a). The ground connection 160 and strike node connection 170 are both generally comprise on-chip metal connections (metal 1 (M1) or metal 2 (M2), etc. if also available) which avoids more complex ESD strike configurations. However, off-chip connections for implementing the ground connection 160 and strike node connection 170 are also possible.

ESD device 100 includes at least one metal layer shown as M1 on a pre-metal dielectric (PMD), with vias shown through the PMD on the topside surface of the isolated epi region 115'. However, as disclosed above, there can be a metal stack including 2 or more layers of metal such as M2 on an interlevel dielectric (ILD) over M1 with vias through the ILD.

DT ring 135 is shown having at a dielectric liner 136. In one embodiment the DT ring 135 comprises the dielectric liner 136 having an inner p-doped region (e.g., p+ doped polysilicon) extending from a top surface of the isolated epi region 115' (topside surface) to contact the substrate 105 under the NBL 110. The deep n+ region 120 provides an n+ ring on the sidewall of the dielectric liner 136 under a surface nwell region 120b having an n+ isolation contact 120a which extends outward and downward to the collector 110a and NBL 110. Dielectric isolation regions are shown collectively as 131 in FIG. 1 being shallow trench isolation (STI) regions which are in the top surface of the p-epi region 115 including in the top surface of the isolated epi region 115'. Although not shown, silicide contacts to the topside surface for the respective contacts can be used.

However, in another isolation arrangement a vertically-diffused deep n+ (no outer DT ring 135 or dielectric liner 136) can be used to connect to the collector 110a and the NBL 110. In this embodiment the deep n+ 120 is replaced by a deep n+ diffusion comprising a vertically-diffused deep n+ region having a lateral diffusion of at least one micron, and generally 2 or more microns. Such a vertically-diffused deep n+ region can be formed by a heavy dose phosphorus implant that is thermally diffused at high temperature including diffusion down to connect with the collector 110a and the NBL 110, which also results in a lateral n+ diffusion of several microns.

Distinctions provided by disclosed ESD device 100 include having its NPN transistor built in the CEO configuration (CEO configuration as used herein to mean the base terminal is not connected to metal), not in a CER or a CES configuration, since as noted above the isolated epi region 115' serves as the CER resistor for the NPN transistor. The avalanche diode 151/152 is also integrated within the NPN transistor 125/118/110a. The avalanche diode's anode 151 by anode contact 151a is tied to ground by ground connection 160 so that it can conduct negative ESD strike current without developing a large voltage drop. The isolated epi region 115' being shared serves as a CER resistor, which renders the NPN transistor's CEO configuration stable and ties the avalanche diode 151/152 to the NPN transistor 125/118/110a. The isolated epi region 115' being shared means the avalanche diode's anode 151 and the NPN's base 118 both utilize a continuous region of the same p-type epi layer, without any intervening diffusions or isolation structures so that they are ohmically connected. However, it is noted that optionally an additional CER resistor can be added (in parallel) to the epi resistor if a lower CER resistance is desired.

Disclosed bipolar ESD protection devices can feature a lateral shallow nwell (SNWELL)-shallow pwell (SPWELL) avalanche diode for NPN's rated at 15V and above in which the SNWELL-SPWELL spacing is chosen to breakdown at a target voltage, for example 20% above the NPN transistor's rating voltage. (See SNW for SNWELL and SPW for SPWELL shown in FIG. 1). For a 5V NPN transistor, it is possible to construct the avalanche diode from a vertical diode such as n+ source/drain (NSD)-SPWELL, p+ source/drain (PSD)-SNWELL, or optional mask combinations such as PSD+PLDD (p-type lightly doped drain)-SNWELL or NSD+NLDD (n-type lightly doped drain)-SPWELL.

Figure 2A:
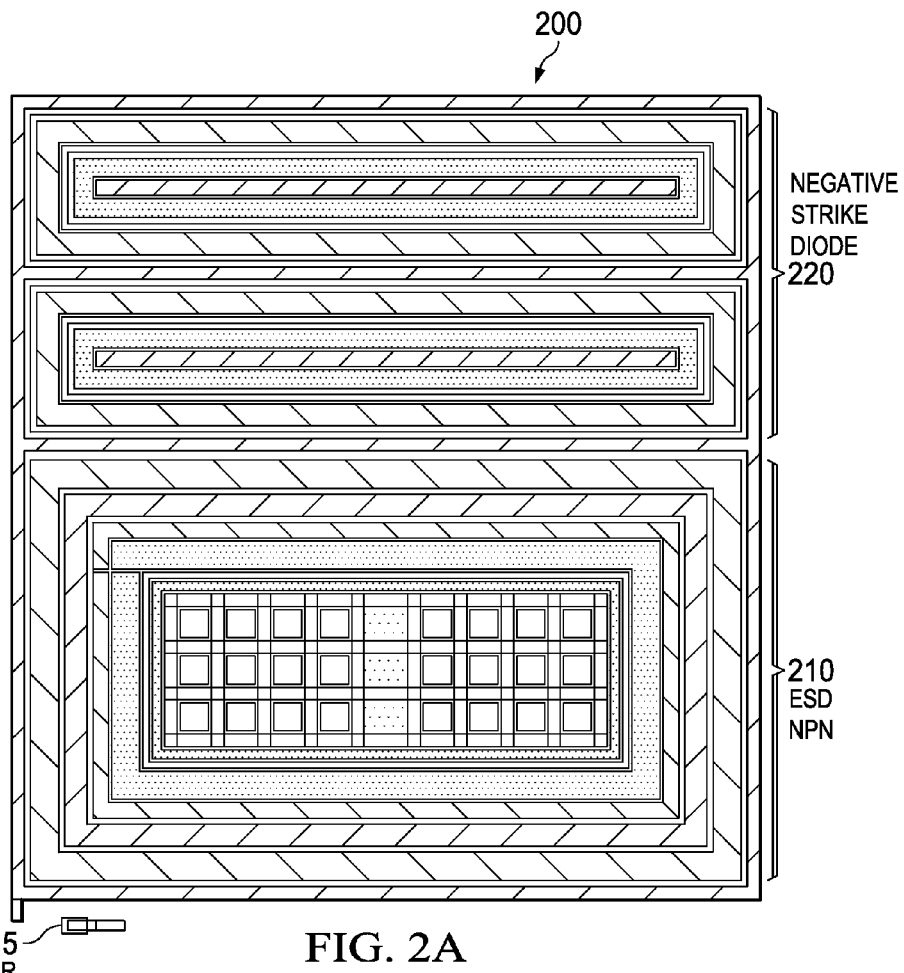
FIG. 2A is a top perspective view of a known ESD cell comprising an NPN transistor in CER configuration including a separate CER resistor and a separate negative-strike diode.

FIG. 2A is a top perspective view of a known 15V ESD clamp cell 200 comprising an NPN transistor 210 shown as ESD NPN. ESD clamp cell 200 includes a separate CER resistor 215 (typically about a 1 kohm polysilicon resistor), and a separate negative-strike diode 220 which is generally based on a similarly-voltage rated LDMOS transistor. As noted above, ESD clamp cell 200 is not able to carry ESD-induced current from a negative ESD strike without developing a large negative voltage since its CER resistor is in series with the current return path through the base of the NPN transistor 210.

Figure 2B:
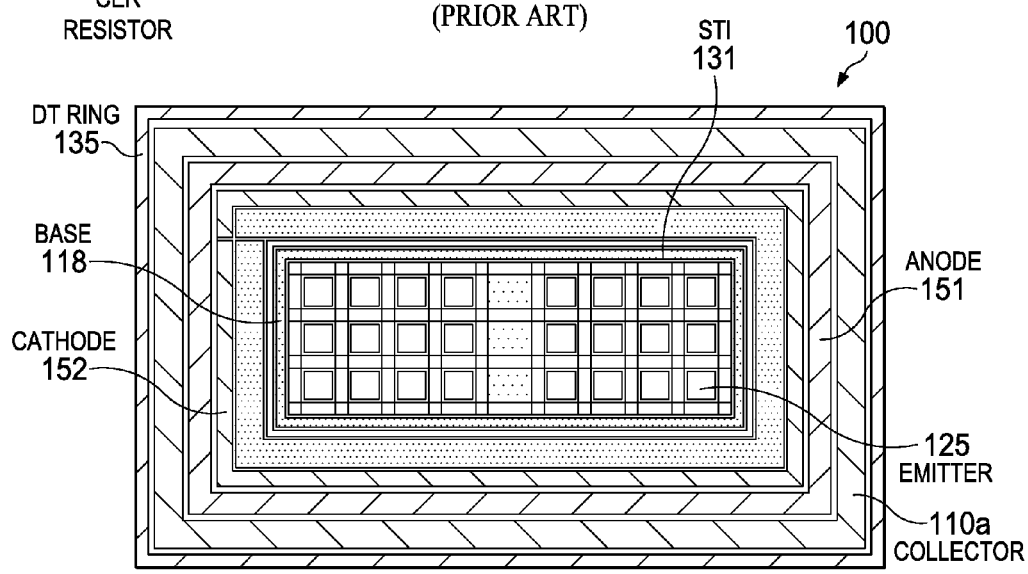
FIG. 2B is a top perspective view of a disclosed ESD device which incorporates an avalanche diode and CER resistor within the NPN unit cell, according to an example embodiment.

FIG. 2B is a top perspective view of an example disclosed ESD device 100 which integrates an avalanche diode and CER resistor from the p-epi region as describe above into the NPN transistor shown above as NPN transistor 125/118/110a, according to an example embodiment. The regions or the contacts to the regions that are buried such as collector 110a identified in FIG. 2B include the anode 151, cathode 152, collector 110a, emitter 125, base 118, and DT ring 135.

By the ESD device 100 eliminating the separate negative strike diode 220 and the CER resistor 215 shown in the ESD clamp cell 200 in FIG. 2A, the ESD device area is cut in half as can be seen by comparing to top perspective view of ESD device 100 shown in FIG. 2B to a top perspective view the ESD clamp cell 200 shown FIG. 2A. Only two high current connections to the NPN transistor are needed for ESD device 100, a "minus" connection to the NPN emitter 125 and anode 151 of the avalanche diode corresponding to ground connection 160 shown in FIG. 1 and a "plus" connection to the n+ isolation contact 120a thus to the collector 110a and the cathode 152 of the avalanche diode corresponding to the strike node connection 170. As a result, there is more metal (e.g., M1 or M2, or M1 for a M1 only process) available to conduct the ESD strike current in a uniform manner, improving the current density that can be carried during an ESD strike. Moreover, as described above, the extra masks of DWELL and SIBLK are not needed by ESD device 100 because the negative strike diode (DWELL) 220 and the CER resistor 215 needed by the ESD clamp cell 200 are both eliminated.

Figure 2C:
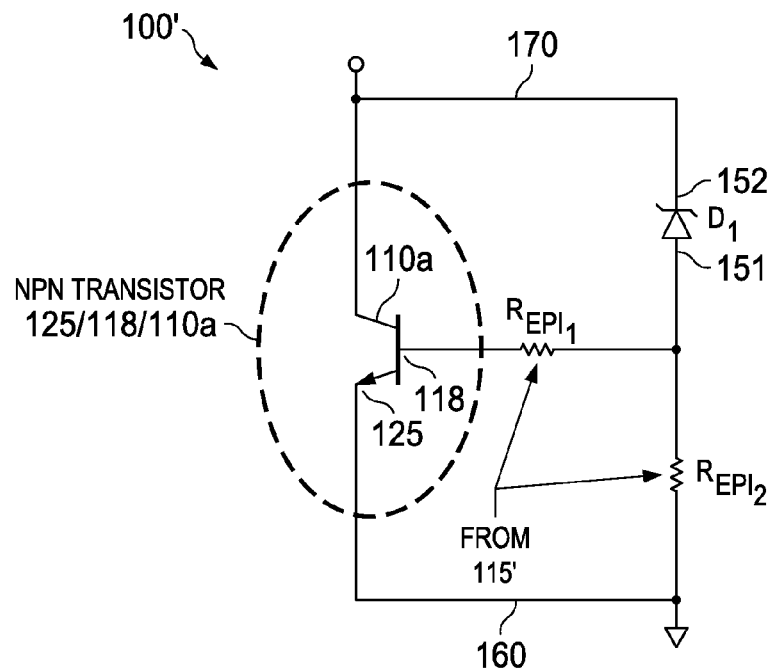
FIG. 2C shows an equivalent circuit for the ESD device shown in FIG. 1 and FIG. 2B that incorporates an avalanche diode within the NPN transistor unit cell.

FIG. 2C shows an equivalent ESD device circuit shown as 100' for ESD device 100 that incorporates an avalanche diode into the NPN transistor unit cell shown in FIG. 1 and FIG. 2B. An avalanche diode 151/152 shown as D1 is between the collector 110a and the base 118 of the NPN transistor 125/118/110a, and a resistor comprising an epi resistor shown as $Repi_1$ and $Repi_2$ couples the base 118 to the emitter 125 which is connected by ground connection 160 for grounding in its system application. Typical resistance ranges for as $Repi_1$ and for $Repi_2$ can be 30 to 3000 Ohms, and the $Repi_1/Repi_2$ ratio range can be from 0.1 to 10.

The strike node connection 170 couples the cathode contact 152a (see FIG. 1) of cathode 152 to the n+ isolation contact 120a (see FIG. 1) that is coupled to collector 110a. The NPN transistor 125/118/110a is thus in the CEO configuration (the base terminal is not connected to metal) since the p-type epi region serves as the CER resistor. Thus, as noted above, the NPN transistor 125/118/110a eliminates the need for a conventional separate negative strike diode and CER resistor, so as a result the cell area for ESD device 100 is cut approximately in half. Only two external high current connections into the NPN transistor 125/118/110a are needed, a "minus" connection to the emitter 125 and D1's anode 151 and a "plus" connection to the + isolation contact 120a (thus to the collector 110a) and D1's cathode 152.

Regarding operation of disclosed ESD device 100, in the event of a negative ESD strike the avalanche diode 151/152 becomes forward-biased and conducts the negative strike current away to the ground connection 160. In the event of a positive strike the strike node voltage will rise until the avalanche diode 151/152 begins to conduct after reverse breakdown, driving the resulting current through its (p-type) anode region 151 into the base 118 of the NPN transistor 125/118/110a. As this current level increases, the resistance of the isolated epi region 115' will cause a potential drop sufficient to forward bias the emitter-to-base (125/118) junction of the NPN transistor 125/118/110a, turning on the NPN transistor 125/118/110a to conduct the positive ESD strike induced current to ground. Disclosed ESD devices in a typical application will be connected between I/O or VDD pads of an IC chip and ground to protect any ESD sensitive I/O or VDD pads/pins from ESD strikes in either polarity (negative strike or positive strike). However, disclosed ESD devices can also be embodied as separate/stand-alone devices.

Figure 3:
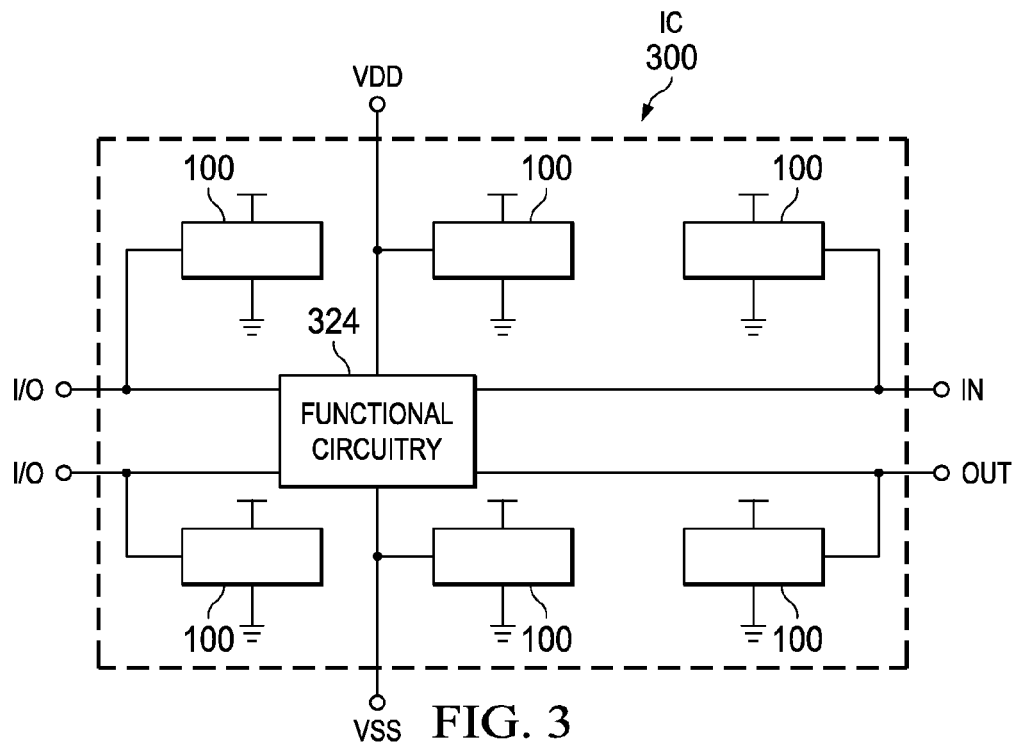
FIG. 3 illustrates a high level depiction of an example ESD protected IC into which disclosed ESD devices are incorporated to protect a plurality of terminals of the IC, according to an example embodiment.

FIG. 3 illustrates a high level depiction of a construction of an IC 300 into which disclosed ESD devices 100 functioning as ESD protection devices are incorporated (integrated) to protect one or more terminals of the IC, according to an example embodiment. The "T" indicated at the top of the respective bipolar ESD device 100 in FIG. 3 represents an input provided by a suitable trigger circuit.

IC 300 includes functional circuitry 324, which is integrated circuitry that realizes and carries out desired functionality of IC 300, such as that of a digital IC (e.g., digital signal processor) or analog IC (e.g., amplifier or power converter), such as a BiMOS IC. The capability of functional circuitry provided by IC 300 may vary, for example ranging from a simple device to a complex device. The specific functionality contained within functional circuitry 324 is not of importance to disclosed embodiments.

IC 300 also includes a number of external terminals, by way of which functional circuitry 324 carries out its function. A few of those external terminals are illustrated in FIG.

3. It is to be understood that the number of terminals and their function can also vary widely. In the example of IC 300 shown in FIG. 3, two terminals shown operate as common input and output terminals (I/O), by way of which functional circuitry 324 can receive incoming signals and can generate outputs, as well known in the art. A dedicated input terminal IN is also shown in FIG. 3 for IC, as is a dedicated output terminal OUT. Each of terminals IN, OUT are also connected to functional circuitry 324. Power supply terminal Vdd receives a positive power supply voltage in this example, while ground terminal Vss is provided to receive a reference voltage, such as system ground. Although not shown, the ground shown connected to bipolar ESD device 100 is coupled to VSS, such as resistively coupled or shorted together.

IC 300 includes an instance of ESD device 100 connected to each of its terminals. Each ESD device 100 is connected to its corresponding terminal in parallel with the functional circuitry 324. ESD devices 100 are also connected to power supply and reference voltage terminals VDD, VSS, in parallel with functional circuitry 324. However, in some applications, some pins of the IC device being protected will be self-protecting, such as diode protected power supply pins. Pins also can be protected against different levels of ESD strike (Human Body Model (HBM), Charged Device Model (CDM), IEC, etc.).

EXAMPLES

Disclosed embodiments are further illustrated by the following specific Examples, which should not be construed as limiting the scope or content of this Disclosure in any way.

Figure 4A:
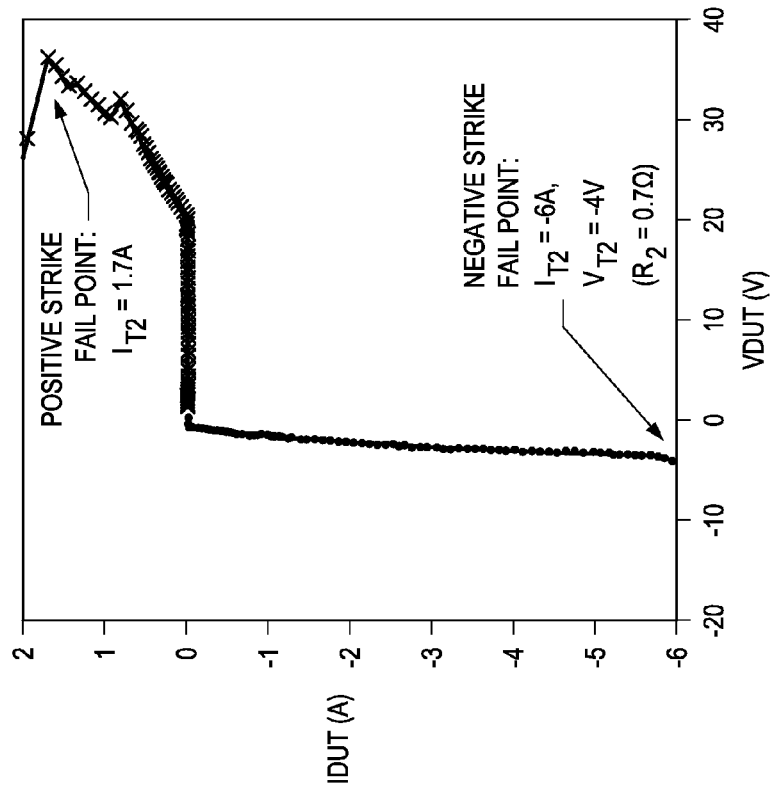
FIGS. 4A and 4B show Transmission Line Pulse (TLP) data for the known NPN transistor shown in FIG. 2A and for a disclosed ESD device which incorporates an avalanche diode and CER resistor within the NPN unit cell, respectively.
Figure 4B:
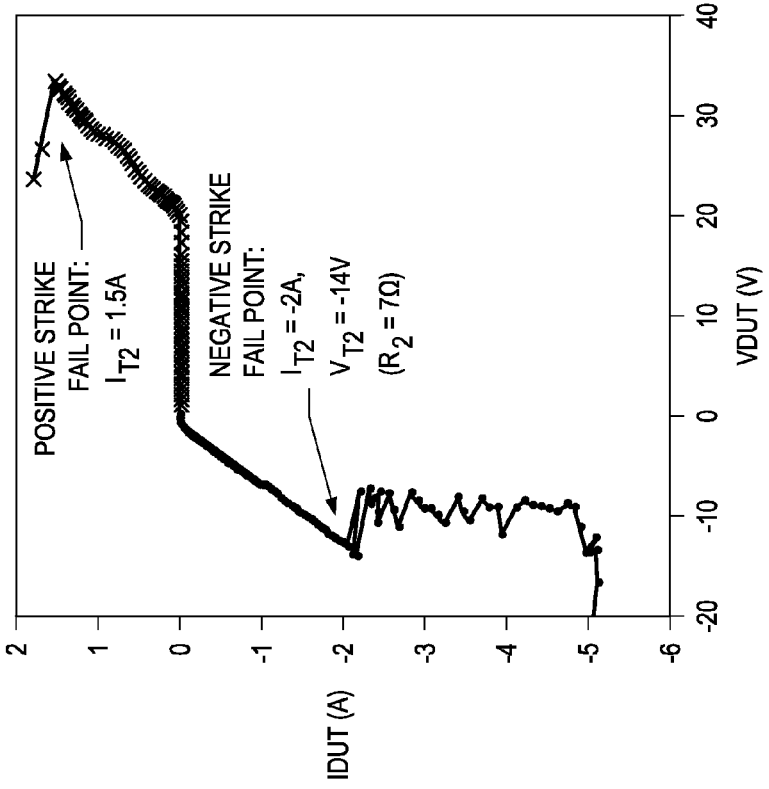

The effectiveness of the disclosed ESD device designs can be seen from the TLP test data in FIGS. 4A and 4B including vastly improved negative strike performance and a slight improvement in forward clamp conduction evident in the TLP data shown. FIGS. 4A and 4B show TLP data for the NPN transistor shown in FIG. 2A and for a disclosed ESD device which incorporates an avalanche diode and CER resistor within the NPN unit cell, respectively. In FIG. 4A the Positive Strike Fail point $I_{T2}$=1.5 A and the Negative Strike Fail point $I_{T2}$=−2 A, $V_{T2}$=−14V, and $R_2$=7Ω. In contrast, in FIG. 4B the Positive Strike Fail point $I_{T2}$=1.7 A and the Negative Strike Fail point $I_{T2}$=−6 A, $V_{T2}$=−4V, and $R_2$=0.7Ω. $I_{T2}$ is the thermal failure current of the ESD device, $V_{T2}$ is the voltage at which thermal failure occurs and R2 is the slope of the I(V) curve leading up to thermal failure (includes such things as metal resistance and any series resistance in the silicon such as the emitter and the collector doped regions).

It can be see that in the negative strike direction, the disclosed ESD device conducts 4 amps more while the strike terminal voltage only goes a few volts (ohmic) beyond a diode drop, whereas the known NPN device without a grounded-anode diode undergoes a negative voltage increase of more than 12 V, before failing at a reverse current of just over 2 Amps. Also of note is that R2 for the disclosed ESD device is lower than the known NPN device, resulting in a much lower VT2. One cannot protect nodes on devices if VT2 is too high, since devices with nodes one is trying to protect from ESD strikes will be destroyed as the I(V) curve slopes out.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A bipolar ESD protection device (ESD device), comprising:
    a substrate having a p-type epi layer (p-epi layer) thereon comprising a p-type epi region over an n-buried layer (NBL);
    an n-type isolation tank (iso tank) comprising a deep n+ region (deep n+), said NBL containing a p-type isolated epi region of said epi region, and said iso tank having an n+ isolation contact;
    an NPN transistor and an avalanche diode both formed in said isolated epi region;
    said NPN transistor including an emitter within a base having a base contact and a collector comprising a top portion of said NBL;
    said avalanche diode including a p-type anode region including an anode contact and an adjacent n-type cathode region having a cathode contact;
    wherein said anode region and said base are resistively coupled together through said isolated epi region;
    a ground connection coupling said emitter to said anode contact, and
    a strike node connection coupling said cathode contact to said n+ isolation contact.

2. The ESD device of claim 1, wherein said iso tank comprises an outer deep trench isolation ring (DT ring) framing said NPN transistor and said avalanche diode, and wherein said deep n+ is on a sidewall of a dielectric liner of said DT ring under a surface nwell region for connecting to said NBL.

3. The ESD device of claim 1, wherein said deep n+ comprises a vertically-diffused deep n+ region having a lateral diffusion of at least one micron.

4. The ESD device of claim 1, wherein said resistively coupled for said anode region and said base comprises a resistance of 30 ohms to 3,000 ohms.

5. The ESD device of claim 1, wherein said substrate is p-doped and said p-epi layer comprises silicon, wherein said substrate is doped from $1 \times 10^{16}$ to $1 \times 10^{19}$ cm$^{-3}$, and wherein said p-epi layer is doped from $3 \times 10^{14}$ cm$^{-3}$ to $3 \times 10^{16}$ cm$^{-3}$.

6. The ESD device of claim 1, wherein said ESD device includes at least one metal layer on a pre-metal dielectric (PMD), wherein said ground connection and said strike node connection are on-chip connections provided by said metal layer.

7. The ESD device of claim 4, wherein said ESD device is exclusive of any additional resistor in parallel to said resistance.

8. An integrated circuit (IC), comprising:
    a substrate having a p-epitaxial (p-epi) layer thereon;
    functional circuitry formed using said p-epi layer configured to realize and carry out a functionality having a plurality of terminals including at least a first terminal and a ground terminal;
    at least one bipolar electrostatic discharge (ESD) protection device (ESD device) formed in said p-epi layer coupled between said first terminal and said ground terminal in parallel to said functional circuitry, said ESD device including:
    a p-type epi region over an n-buried layer (NBL) formed in said p-epi layer thereon;
    an n-type isolation tank (iso tank) comprising a deep n+ region (deep n+), said NBL containing a p-type isolated epi region of said epi region, and said iso tank having an n+ isolation contact;

an NPN transistor and an avalanche diode both formed in said isolated epi region;

said NPN transistor including an emitter within a base having a base contact and a collector comprising a top portion of said NBL;

said avalanche diode including a p-type anode region including an anode contact and an adjacent n-type cathode region having a cathode contact;

wherein said anode region and said base are resistively coupled together through said isolated epi region;

a ground connection coupling said emitter to said anode contact, and a strike node connection coupling said cathode contact to said n+ isolation contact.

9. The IC of claim 8, further comprising an outer deep trench isolation ring (outer DT ring) framing said NPN transistor and said avalanche diode, and wherein said deep n+ is on a sidewall of a dielectric liner of said DT ring under a surface nwell region for connecting to said NBL.

10. The IC of claim 8, wherein said deep n+ comprises a vertically-diffused deep n+ region having a lateral diffusion of at least one micron.

11. The IC of claim 8, wherein said resistively coupled for said anode region and said base comprises a resistance of 30 ohms to 3,000 ohms.

12. The IC of claim 8, wherein said substrate is p-doped and said p-epi layer comprises silicon, wherein said substrate is doped from $1\times10^{16}$ to $1\times10^{19}$ cm$^{-3}$, and wherein said p-epi layer is doped from $3\times10^{14}$ cm$^{-3}$ to $3\times10^{16}$ cm$^{-3}$.

13. The IC of claim 8, wherein said ESD device includes at least one metal layer metal 1 (M1) on a pre-metal dielectric (PMD), wherein said ground connection and said strike node connection are on-chip connections provided by said metal layer.

14. The IC of claim 11, wherein said ESD device is exclusive of any additional resistor in parallel to said resistance.

15. The IC of claim 8, wherein said IC comprises a Bipolar Metal Oxide Semiconductor (BiMOS) IC device.

* * * * *